US012622194B2

(12) United States Patent
Hsu et al.

(10) Patent No.: US 12,622,194 B2
(45) Date of Patent: May 5, 2026

(54) SEMICONDUCTOR STRUCTURE INCLUDING DEVICES WITH DIFFERENT CHANNEL LENGTHS, AND METHOD FOR MANUFACTURING THE SAME

(71) Applicant: TAIWAN SEMICONDUCTOR MANUFACTURING COMPANY, LTD., Hsinchu (TW)

(72) Inventors: Tzu-Hsiang Hsu, Hsinchu (TW); Sun-Yi Chang, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 400 days.

(21) Appl. No.: 18/342,192

(22) Filed: Jun. 27, 2023

(65) Prior Publication Data

US 2025/0006505 A1    Jan. 2, 2025

(51) Int. Cl.
| | |
|---|---|
| *H01L 21/311* | (2006.01) |
| *H01L 21/3105* | (2006.01) |
| *H01L 21/768* | (2006.01) |
| *H10D 84/83* | (2025.01) |

(52) U.S. Cl.
CPC .. *H01L 21/31144* (2013.01); *H01L 21/31051* (2013.01); *H01L 21/768* (2013.01); *H10D 84/83* (2025.01)

(58) Field of Classification Search
CPC ........... H01L 21/31144; H01L 21/3105; H01L 21/768; H01L 21/76816; H01L 21/76819; H10D 84/83
See application file for complete search history.

(56) References Cited

U.S. PATENT DOCUMENTS 9,991,326 B2 * 6/2018 Iijima .................. H10K 59/131
2018/0374744 A1 * 12/2018 Wu ................... H01L 21/76832

* cited by examiner

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

A method for manufacturing a semiconductor structure includes: forming an interconnect level structure having a first device region, a first side region aside the first device region, a second device region and a second side region aside the second device region; forming a dielectric layer over the interconnect structure, the dielectric layer including a first dielectric portion, a second dielectric portion, a first patterned portion and a second patterned portion that are respectively formed over the first device region, the second device region, the first side region, and the second side region, the first patterned portion and the second patterned portion being formed with different patterns; performing a planarization process on the dielectric layer; forming first recesses and second recesses respectively in the planarized first dielectric portion and the planarized second dielectric portion; and forming contact portion respectively in the first recesses and the second recesses.

20 Claims, 11 Drawing Sheets

SEMICONDUCTOR STRUCTURE INCLUDING DEVICES WITH DIFFERENT CHANNEL LENGTHS, AND METHOD FOR MANUFACTURING THE SAME

BACKGROUND

At back end of line (BEOL) process, devices are incorporated into standard BEOL interconnecting structures. New methods are developed to make manufacturing of the BEOL devices easier and more effective.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
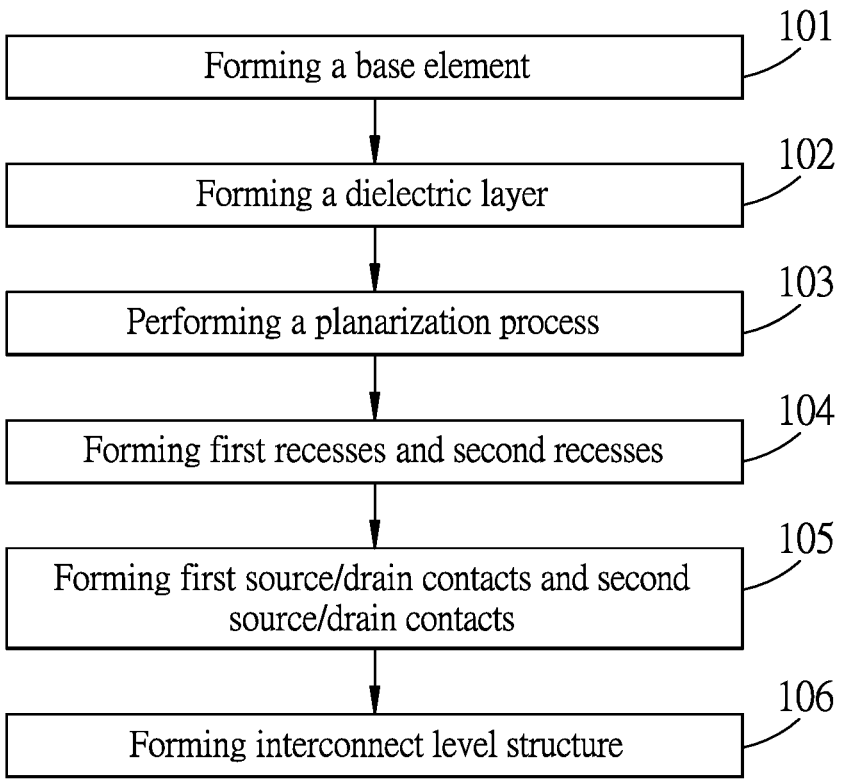
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost." "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

Back end of line (BEOL) may include a logic area and a memory area. The logic area may include vias or metal lines. The memory area may include devices, for example, but not limited to, memory devices, or other suitable devices. In some embodiments, the devices in the memory area may each include a channel, a gate, a dielectric disposed to isolate the channel from the gate, and source/drain contacts disposed on and connected to the channel opposite to the gate. A distance between two adjacent ones of the source/drain contacts is known as a channel length of the device. In some cases, in order to obtain a plurality of the devices having a uniform channel length, a self-aligned litho-etch-litho-etch (SALE-2) approach may be adopted in formation of the source/drain contacts. Specifically, formation of the source/drain contacts involves patterning of an interlayer dielectric disposed over the channels of the devices, so as to form source/drain recesses penetrating the interlayer dielectric. In patterning of the interlayer dielectric, spacers are formed to serve as patterning masks, such that any two adjacent ones of the source/drain recesses formed thereby are spaced apart by a uniform distance. The source/drain contacts formed in the source/drain recesses are thus spaced apart from each other by an identical distance, resulting in that the devices formed therefrom have an identical and uniform channel length. It is noted that there are many potential enhancements in the abovementioned technique.

The present disclosure is directed to a semiconductor structure including devices produced in a back-end-of-line (BEOL) process having different channel lengths, and a method for manufacturing the same.

FIG. 1 is a flow diagram illustrating a method for manufacturing the semiconductor structure in accordance with some embodiments. FIGS. 2 to 11 illustrate schematic views of intermediate stages of the method in accordance with some embodiments. Some repeating structures are omitted in FIGS. 2 to 11 for the sake of brevity. Additional steps can be provided before, after or during the method, and some of the steps described herein may be replaced by other steps or be eliminated.

Figure 2:
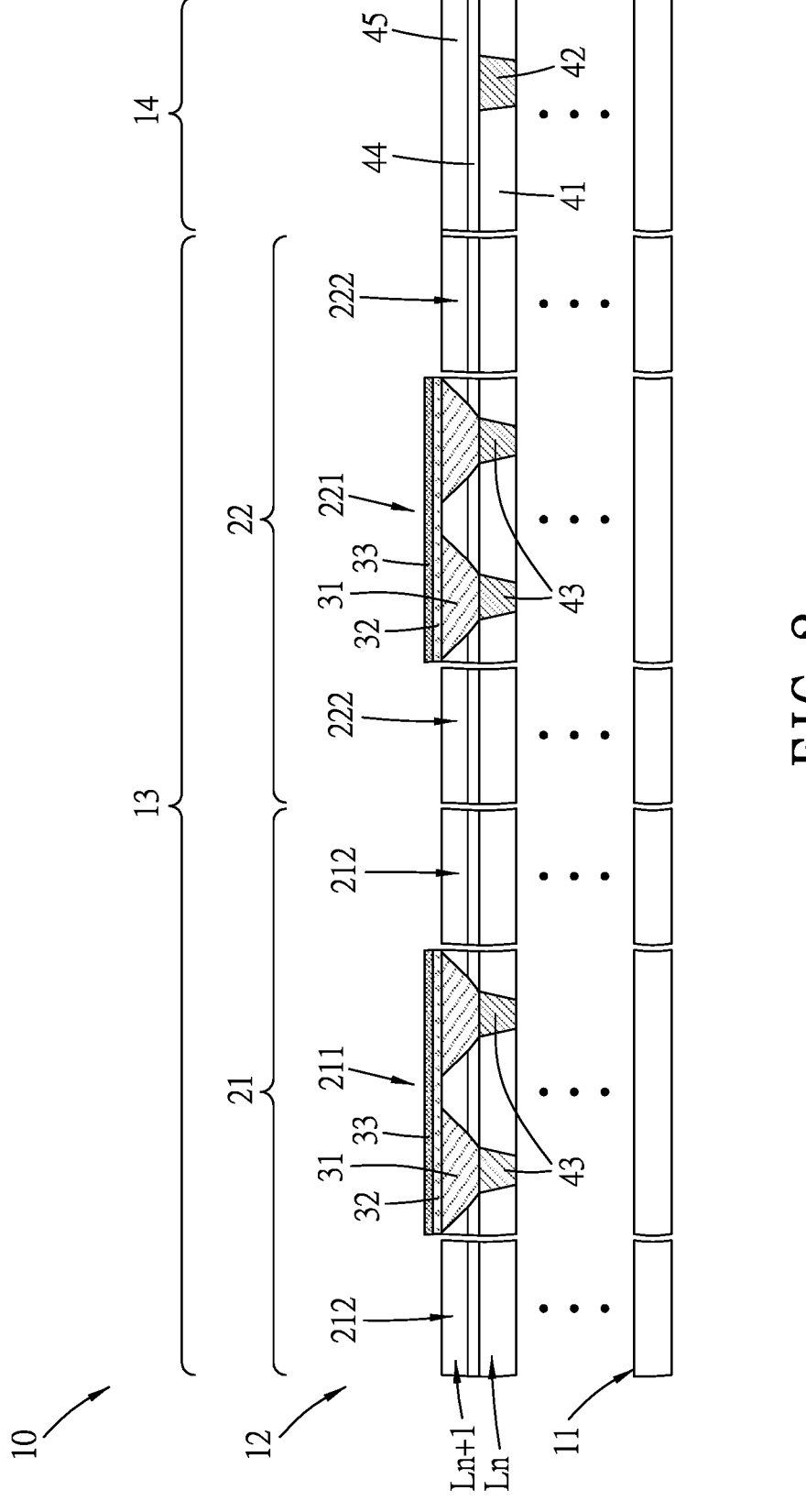
FIGS. 2 to 11 are schematic views illustrating intermediate stages of the method for manufacturing the semiconductor structure in accordance with some embodiments.

Referring to FIG. 1 and the example illustrated in FIG. 2, the method begins at step 101, where a base element 10 is formed. The base element 10 includes a substrate 11, and a front-end-of-line (FEOL) part (not shown) formed on the substrate 11. The substrate 11 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the substrate 11 may be doped with p-type impurities or n-type impurities, or undoped. In addition, the substrate 11 may be a bulk silicon substrate, a silicon-oninsulator (SOI) substrate, or a germanium-on-insulator (GOI) substrate. Other suitable materials for the substrate 11 are within the contemplated scope of disclosure. The FEOL part may include any suitable elements such as active devices (for example, transistors such as fin-type field-effect transistors (FinFET), nanosheet semiconductor devices, e.g. gate-all-around-field-effect transistors (GAAFET), fork-sheet-based devices, complementary transistors (CFET), or the like), passive devices (for example, capacitors, resistors, or the like), decoders, amplifiers, other suitable devices, and combinations thereof. The base element 10 may further include any other suitable components according to practical needs.

The base element 10 further includes a back-end-of-line (BEOL) part 12 formed on the FEOL part. The BEOL part 12 includes a contact level structure L0 (not shown) formed on the FEOL part, and a plurality of interconnect level structures L1 to Ln+1 (the interconnect level structures L1 to Ln−1 are not shown) formed on the contact level structure L0.

The interconnect level structure Ln+1 includes a memory area 13 and a logic area 14 that are formed in an interlayer dielectric (ILD) 45. The ILD 45 may include silicon oxide (SiO), silicon nitride (SiN), silicon carbide (SiC), silicon oxycarbide (SiOC), silicon ocynitride (SiON), polyimide, epoxy resin, acrylic resin, phenol resin, benzocyclobutene (BCB), polybenzooxazole (PBO), other suitable polymer-based dielectric materials, or combinations thereof. Other suitable materials for the ILD 45 are within the contemplated scope of the present disclosure.

The memory area 13 includes a first device portion 21 and a second device portion 22 displaced apart from the first device portion 21. The first device portion 21 includes a first device region 211 and a first side region 212 aside the first device region 211. The second device portion 22 includes a second device region 221 and a second side region 222 aside the second device region 221. In some embodiments, the first side region 212 (or the second side region 222) may be a continuous region surrounding the first device region 211 (or the second device region 221), or may be several discrete regions disposed aside of the first device region 211 (or the second device region 221). For the example shown in FIG. 2, and in the following descriptions, there are two first side regions 212 sandwiching the first device region 211, and two second side regions 222 sandwiching the second device region 212.

Each of the first and second device regions 211, 221 includes a gate element 31 formed in the ILD 45, a channel layer 33 formed on the gate element 31, and a dielectric layer 32 disposed between the channel layer 33 and the gate element 31, so as to separate the gate element 31 and the channel layer 33 from each other. The gate element 31 may include a plurality of gate components. For example, as shown in FIG. 2, each of the gate element 31 includes two gate components. Each of the gate components, a corresponding portion of the channel layer 33, a corresponding portion of the dielectric layer 32, and two corresponding adjacent ones of source/drain contacts 71, 72 (see FIG. 10, which will be discussed later) together serve as an individual device. The device may be, for example, but not limited to, a memory device. The gate element 31 may include a metallic material (for example, silver, aluminum, copper, tungsten, nickel, or the like, or combinations thereof), a metal compound (for example, titanium nitride, tantalum nitride, a metal silicide, or the like, or combinations thereof), polycrystalline silicone, or doped silicon. The channel layer 33 may include an oxide semiconductor material, (for example, but not limited to, indium gallium zinc oxide (InGaZnO, IGZO), tungsten-doped indium oxide (InWO), indium zinc oxide (InZnO), indium tin oxide (InSnO), gallium oxide (GaO$_x$), indium oxide (InO$_x$) and the like), amorphous silicon, crystalline silicon, or the like. The dielectric layer 32 may include silicon oxide, silicon nitride, silicon oxynitride, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide (Al$_2$O$_3$), a hafnium dioxide-alumina (HfO$_2$—Al$_2$O$_3$) alloy, or combinations thereof. Other suitable materials for the gate element 31, the channel layer 33, and the dielectric layer 32 are within the contemplated scope of the present disclosure.

The interconnect level structure Ln includes a plurality of contact components 43 formed in an ILD 41, and each of the contact components 43 is connected to a respective one of the gate components in the memory area 13. The interconnect level structure Ln may further include a contact component 42, such as via, or metal line, or any other suitable BEOL component at position corresponding to the logic area 14. The ILD 41 may be made of a material same as or different from the ILD 45. Each of the contact components 42, 43 may independently include cobalt, tungsten, copper, titanium, tantalum, aluminum, zirconium, hafnium, the like, the combinations thereof, or alloys thereof. Other suitable materials for the ILD 41 and the contact components 42, 43 are within the contemplated scope of the present disclosure.

In some embodiments, the interconnect level structure Ln and the interconnect level structure Ln+1 may be formed by the following steps: (i) forming an ILD material layer (not shown, which is to form the ILD 41); (ii) patterning the ILD material layer to form recesses (not shown); (iii) forming contact components 42, 43 in the recesses, thereby forming the contact level structure Ln; (iv) forming an etch stop layer 44 over the interconnect level structure Ln; (v) forming another ILD material layer (not shown, which is to form the ILD 45); (vi) patterning the another ILD material layer and the etch stop layer 44 to form recesses (not shown) exposing the contact components 42; (vii) forming the gate components of the gate elements 31 respectively in the recesses, such that each of the gate components of the gate elements 31 is connected to a respective one of the contact components 42; (viii) forming a dielectric material layer over the gate elements 31 and the another ILD material layer; (ix) forming a channel material layer over the dielectric material layer; and (x) removing portions of the dielectric material layer and the channel material layer disposed on the first side regions 212, the second side regions 222 and the logic area 14, thereby forming the channel layers 33 and the dielectric layers 32 of the first and second device regions 211, 221, and thus the interconnect level structure Ln. The etch stop layer 44 may include silicon oxide (SiO$_x$), silicon carbide (SiC$_x$), silicon oxycarbide (SiC$_x$O$_y$), silicon nitride (SiN$_x$), silicon carbide nitride (SiC$_x$N$_y$), silicon oxynitride (SiO$_x$N$_y$), aluminum oxynitride (AlO$_x$N$_y$), aluminum nitride (AlN$_x$) or aluminum oxide (AlO$_x$), and may be doped with hafnium (Hf), zirconium (Zr), or yttrium (Y). Other suitable materials for the etch stop layer 44 are within the contemplated scope of the present disclosure. In each of the above steps (i) to (x), one or more deposition processes (such as chemical vapour deposition (CVD), atomic layer deposition (ALD), other suitable processes, or combinations thereof), one or more patterned photoresist formation processes (such as coating a photoresist, exposing the photoresist through a photomask, developing the photoresist to form a patterned photoresist, and/or other suitable processes), one or more stripping or ashing processes for removal of the patterned photoresist, one or more etching processes using or without using the patterned photoresist (such as dry etching, wet etching, anisotropic etching, other suitable techniques, or combinations thereof), one or more planarization processes (such as, chemical-mechanical planarization (CMP), or other suitable processes, and/or other suitable processes) may be used, but not limited thereto. Other suitable components and/or processes for forming the base element 10 are within the contemplated scope of the present disclosure.

Figure 4:
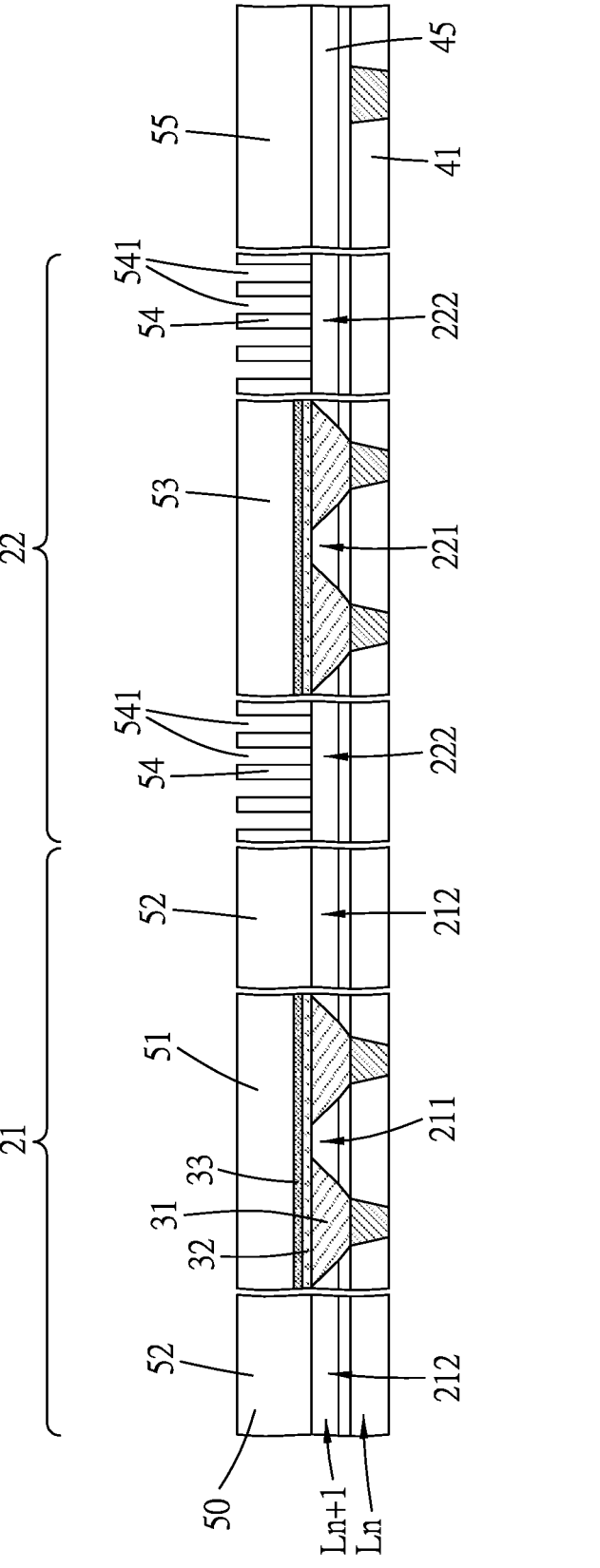
Figure 5:
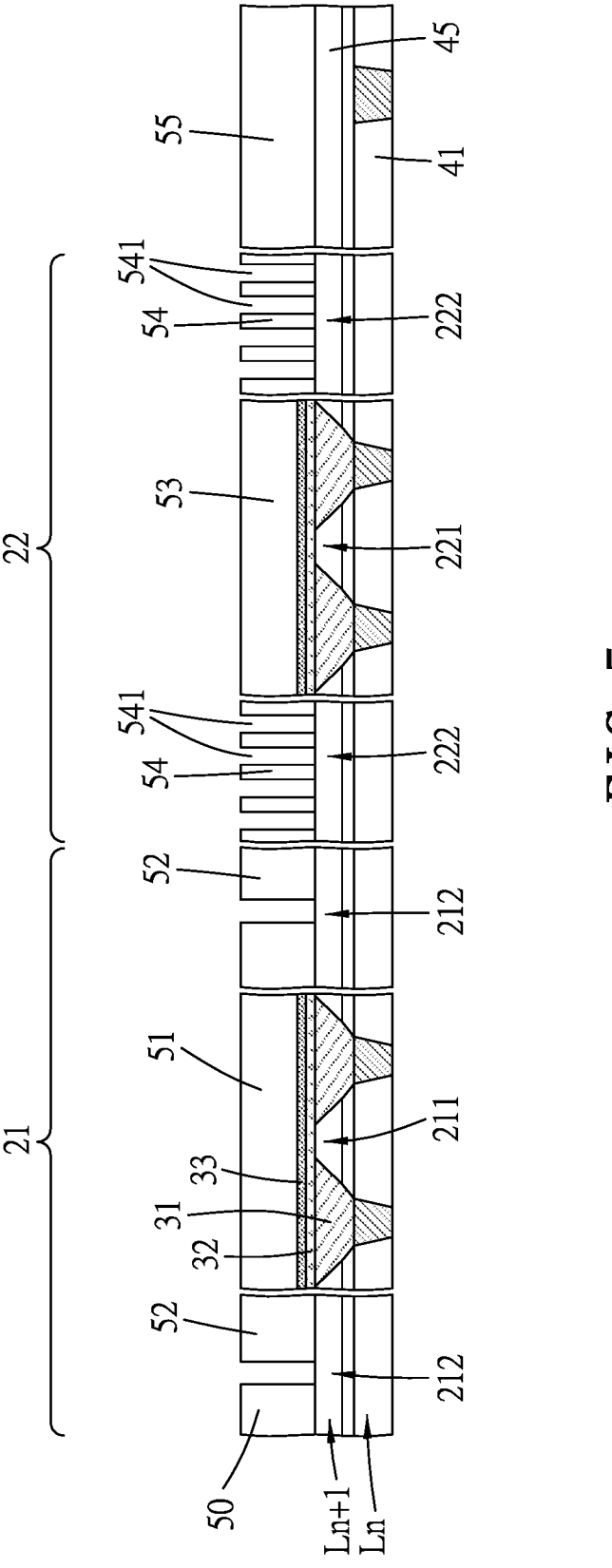

Referring to FIG. 1 and the example illustrated in FIGS. 4 and 5, the method proceeds to step 102, where a dielectric layer 50 is formed over the interconnect structure Ln+1. The dielectric layer 50 may serve as an interlayer dielectric, and may be made of a material same as or different from that of the ILD 45. The dielectric layer 50 includes a first dielectric portion 51 formed over the first device region 211, two first patterned regions 52 respectively formed over the first side regions 212, a second dielectric portion 53 formed over the second device region 221, and two second patterned region 54 respectively formed over the second side regions 222. In some embodiments, a number of the first patterned regions 52 is same as a number of the first side regions 212, and a number of the second patterned regions 54 is same as a number of the second side regions 222. FIG. 4 illustrates a structure after step 102 in accordance with some embodiments. FIG. 5 is a variation of the structure shown in FIG. 4 in accordance with some embodiments.

Step 102 aims to achieve: (1) the first patterned portions 52 and the second patterned portions 54 that are formed with different patterns; and (2) each of the first dielectric portion 51 and the second dielectric portion 53 having a planar top surface opposite to a corresponding one of the first device region 211 and the second device region 221, so as to facilitate step 103 to be performed subsequently.

For item (1), one may design the different patterns of the first and second patterned portions 52, 54 based on practical requirements. That is, in some embodiments, the first patterned portions 52 may be formed with a first pattern, and the second patterned portions 54 may be formed with a second pattern, while the first pattern is different from the second pattern. In some embodiments, each of the first patterned portions 52 and the second patterned portions 54 may be independently formed into at least one dummy insertion (see FIG. 4). In other embodiments, each of the first and second patterned portions 52, 54 may be formed into a plurality of dummy insertions (see FIG. 5). The dummy insertions of each of the first patterned portions 52 may have a number and/or a configuration different from a number and/or a configuration of the dummy insertions of each of the second patterned portions 54. In the case that the number of the dummy insertions of each of the first patterned portions 52 is the same as the number of the dummy insertions of each of the second patterned portions 54, the configuration of the dummy insertions of each of the first patterned portions 52 is different from the configuration of the dummy insertions of each of the second patterned portions 54. For instance, the configuration of the dummy insertions may be varied in terms of shapes, widths (measured along a plane parallel to a bottom surface of the dielectric layer 50) and/or arrangements, such as densities, and/or spatial arrangements (the dummy insertions may be randomly arranged, or may be uniformly arranged to be equally spaced apart from each other, or a spaced-apart distance between two adjacent ones of the dummy insertions may be changed in gradual manner). Other suitable configurations and/or variations in designing the first and second patterned portions 52, 54 are within the contemplated scope of the present disclosure. In the example shown in FIG. 4, each of the first patterned portions 52 is formed as a block serving as one dummy insertion; and each of the second patterned portions 54 is formed with a plurality of (e.g. 5, but is not limited thereto) dummy insertions that are equally spaced apart from each other by a plurality of grooves 541 formed therebetween.

For item (2), in some embodiments, the first and second dielectric portions 51, 53 are plain dielectric portions that are not patterned. In some embodiments, the planar top surfaces of the first and second dielectric portions 51, 53 are flush with each other.

In some embodiments, step 102 may include the following sub-steps: (i) forming a dielectric material layer 56 (which is to form the dielectric layer 50 shown in FIG. 4, see FIG. 3) over the interconnect stricture Ln+1; (ii) forming a shielding mask 57 over the dielectric material layer 56; (iii) patterning the dielectric material layer 56 through the shield mask 57, thereby forming the dielectric layer 50 (see FIG. 4), and (iv) removing the shielding mask 57. Other suitable methods for forming the dielectric layer 50 are within the contemplated scope of the present disclosure. In sub-steps (i) to (iv) of step 102, one or more deposition processes (such as CVD, ALD), other suitable processes, or combinations thereof), one or more patterned photoresist formation processes for forming the shielding mask 57 (such as coating a photoresist, exposing the photoresist through a photomask, developing the photoresist to form a patterned photoresist, and/or other suitable processes), one or more stripping or ashing processes for removal of the patterned photoresist, one or more etching processes using or without using the patterned photoresist (such as dry etching, wet etching, anisotropic etching, other suitable techniques, or combinations thereof), one or more planarization processes (such as, CMP, or other suitable processes, and/or other suitable processes) may be used, but not limited thereto.

In sub-step (ii), the shielding mask 57 may be a patterned photoresist or a patterned hard mask which is patterned using a patterned photoresist. Portions of the dielectric material layer 56 shown in FIG. 3 over the first and second device regions 211, 221 are covered in sub-step (ii), so as to be protected from the patterning process in sub-step (iii), thereby forming the planar top surfaces of the first and second dielectric portions 51, 53 that are flush with each other. Portions of the dielectric material layer 56 over the first and second side regions 212, 222 may be partially covered by the shielding mask 57 in different extents, so as to be formed into different patterns in sub-step (iii). That is, a pattern of a portion of the shielding mask 57 covering the first side regions 212 may be different from a pattern of another portion of the shielding mask 57 covering the second side regions 222.

Figure 3:
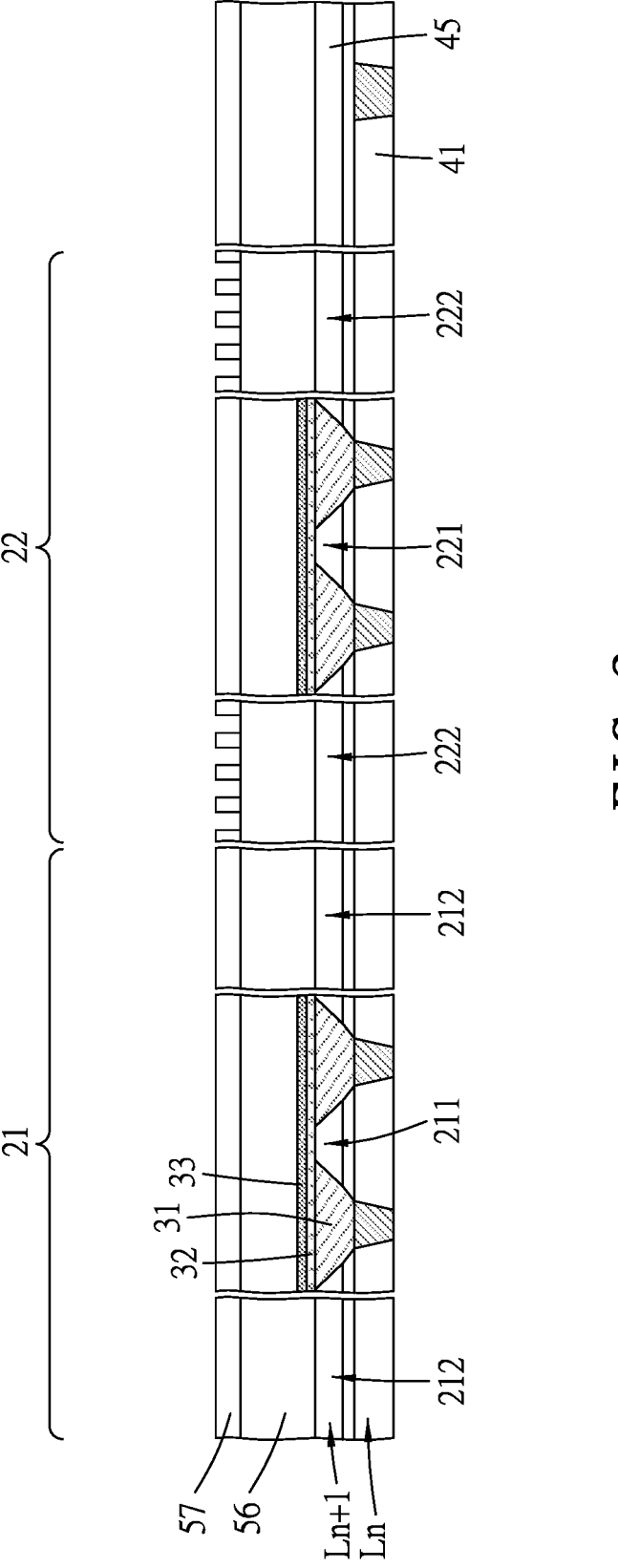

In some embodiments, as shown in FIG. 3, in sub-step (ii), the shielding mask 57 covers a first portion of the dielectric material layer 56 (in position corresponding to the first device region 211, the second device region 221, and the first side regions 212), and partially exposes a second portion of the dielectric material layer 56 (in position corresponding to the second side regions 222). As such, in sub-step (iii), the first portion of the dielectric material layer 56 covered by the shielding mask 57 serves as the first dielectric portion 51, the second dielectric portion 53, and the first patterned portions 52 of the dielectric layer 50, and the second portion of the dielectric material layer 56 is patterned to form the second patterned portions 54.

Figure 6:
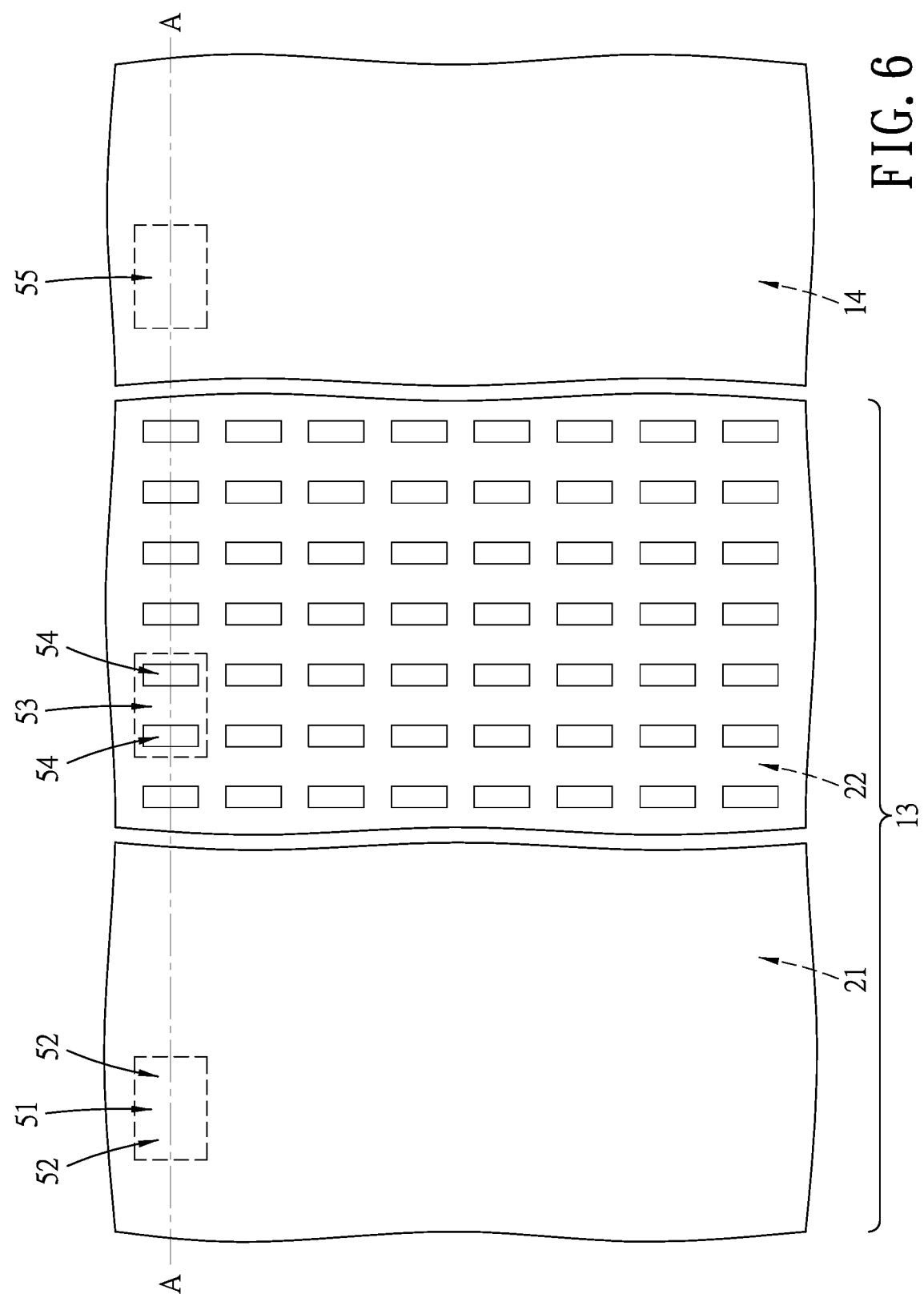

In some embodiments, the dielectric layer 50 may further include a logic dielectric portion 55 formed over the logic area 14 (see also FIG. 6). A top surface of the logic dielectric portion 55 may be flush with top surfaces of each of the first and second dielectric portions 51, 53, and the first and second patterned portions 52, 54 at the memory area 13.

FIG. 4 shows a cross-sectional view of the structure after completing step 102, whereas FIG. 6 is a top view of the structure after completing step 102. The cross-sectional view of the structure is taken along line A-A shown in FIG. 6. The portions 51, 52, 53, 54 and 55 shown in FIG. 4 are indicated by dotted-line frames in FIG. 6. In accordance with some embodiments, the first device portion 21 may include a plurality of the first device regions 211 (not shown in FIG. 6) that are respectively covered by the first dielectric portions 51 (only one is marked), and a plurality of the first side regions 212 (not shown in FIG. 6) that are respectively covered by the first patterned portions 52. The second device portion 22 may include a plurality of the second device regions 221 (not shown in FIG. 6) that are respectively covered by the second dielectric portions 53 (only one is marked), and a plurality of the second side regions 222 (not shown in FIG. 6) that are respectively covered by the second patterned portions 54.

Figure 7:
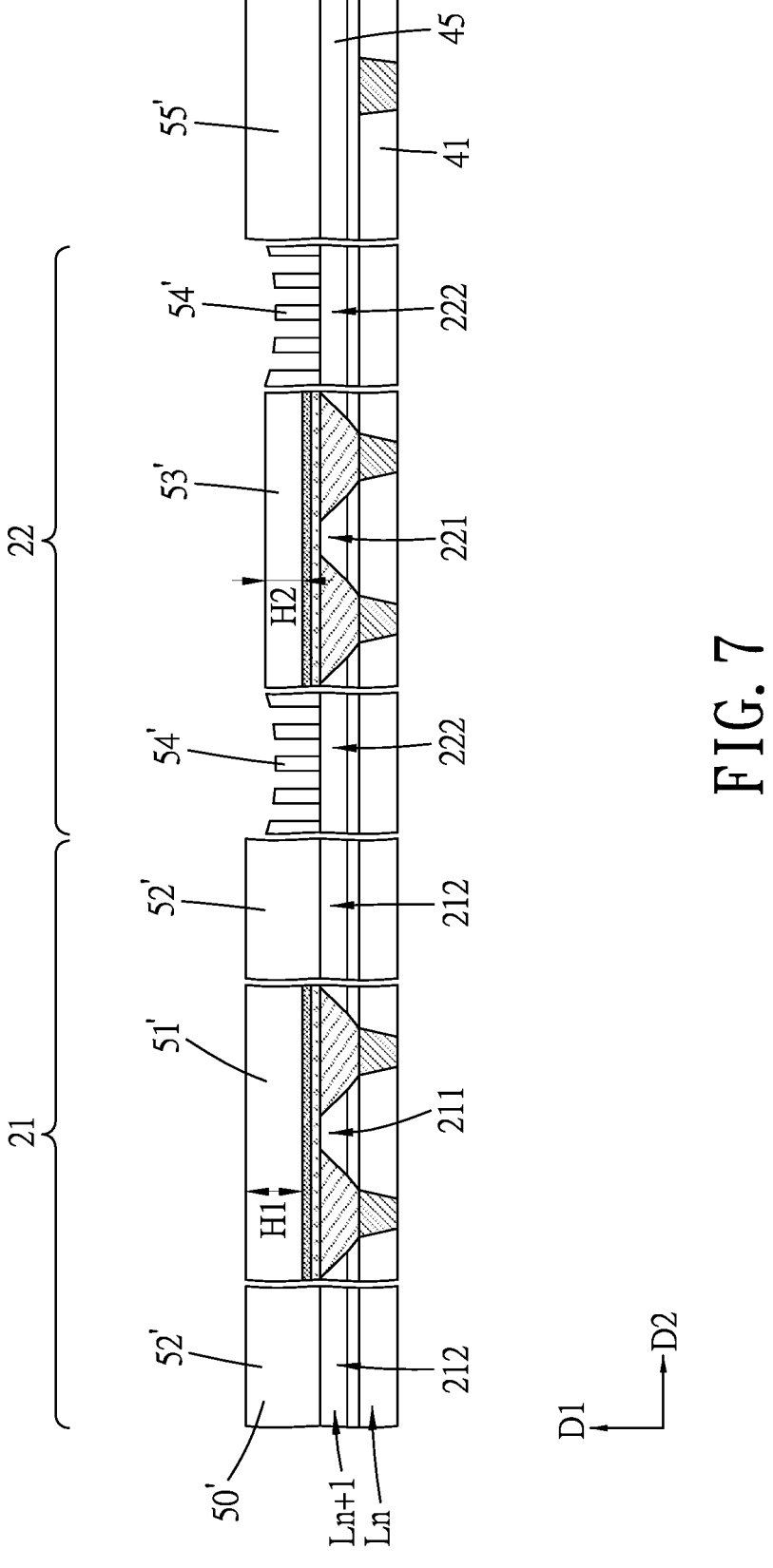

Referring to FIG. 1 and the example illustrated in FIG. 7, the method proceeds to step 103, where a planarization process is performed on the dielectric layer 50 (see FIG. 4), such that a top surface of the planarized first dielectric portion 51' is at a level different from that of a top surface of the planarized second dielectric portion 53'. In some embodiments, the planarization process, may be a CMP process, but is not limited thereto. Other suitable planarization processes are within the contemplated scope of the present disclosure. Working conditions and parameters of the CMP process may be determined according to practical needs, and may be kept consistent over each of the portions 51, 52, 53 and 54, such that a CMP rate of the dielectric material over each of the first and second device regions 211, 221 is mainly dependent on the different patterns of the first and second patterned portions 52, 54, but not different working conditions or parameters of the CMP process.

Step 103 aims to achieve a height difference between the planarized first dielectric portion 51' and the planarized second dielectric portion 53' that are made from the same dielectric material. In accordance to some embodiments, the first patterned portions 52 located at the first device portion 21 and the second patterned portions 54 located at the second device portion 22 are formed with different patterns in step 102 (see also FIG. 4 or 5), resulting in discrepancy between a compactness of the dielectric material over the first device portion 21 (i.e., the first dielectric portion 51 and the first patterned portions 52) and a compactness of the dielectric material over the second device portion 22 (i.e., the second dielectric portion 53 and the second patterned portions 54). As such, a first CMP rate over the first dielectric portion 51 is different from a second CMP rate over the second dielectric portion 53.

For example, as shown in FIG. 4, at the first device portion 21, the first dielectric portion 51 and the first patterned portions 52 are each formed as a solid block. At the second device portion 22, the second dielectric portion 53 is formed as a solid block, and the second patterned portions 54 are each formed with a plurality of dummy insertions that are spaced apart from each other by a plurality of grooves 541. As such, the dielectric material at the first dielectric portion 51 and the first patterned portions 52 over the first device portion 21 are comparatively more compact than the dielectric material at the second dielectric portion 53 and the second patterned portions 54 over the second device portion 22. Therefore, the first CMP rate over the first dielectric portion 51 is slower than the second CMP rate over the second dielectric portion 53. Considering that the CMP process starts at the top surfaces of the first and second dielectric portions 51, 53 which are flush with each other, referring to FIG. 7, in the CMP process, less amount of the dielectric material of the first dielectric portion 51 is removed, resulting in the planarized first dielectric portion 51' having with a comparatively greater height, and greater amount of the dielectric material of the second dielectric portion 53 is removed, resulting in the planarized second dielectric portion 53' having with a comparatively smaller height. Thus, after the CMP process, the top surface of the planarized first dielectric portion 51' is at a level higher from that of the top surface of the planarized second dielectric portion 53'. In some embodiments, the CMP rate for each of the second dielectric portion 53 and the second patterned portions 54 may be the same or different, and thus the height of each of the planarized second dielectric portion 53' and the planarized second patterned portion 54' may also be the same or different.

As shown in FIG. 7, the planarized first dielectric portion 51' has a first height H1 in a first direction D1 (i.e., a distance between the top surface and the bottom surface of the planarized first dielectric portion 51'), and the planarized second dielectric portion 53' has a second height H2 in the first direction D1 (i.e., a distance between the top surface and the bottom surface of the planarized second dielectric portion 53'). The first height H1 is greater than the second height H2. In some embodiments, each of the first height H1 and the second height H2 may range from about 200 Å to about 400 Å. In some embodiments, the difference between the first height H1 and the second height H2 may range from about 50 Å to about 150 Å. Other suitable ranges for the first height H1 and the second height H2, and the difference therebetween are within the contemplated scope of the present disclosure.

In some embodiments, the logic dielectric portion 55 shown in FIG. 4 may also be planarized to obtain the planarized logic dielectric portion 55' shown in FIG. 7.

Figure 8:
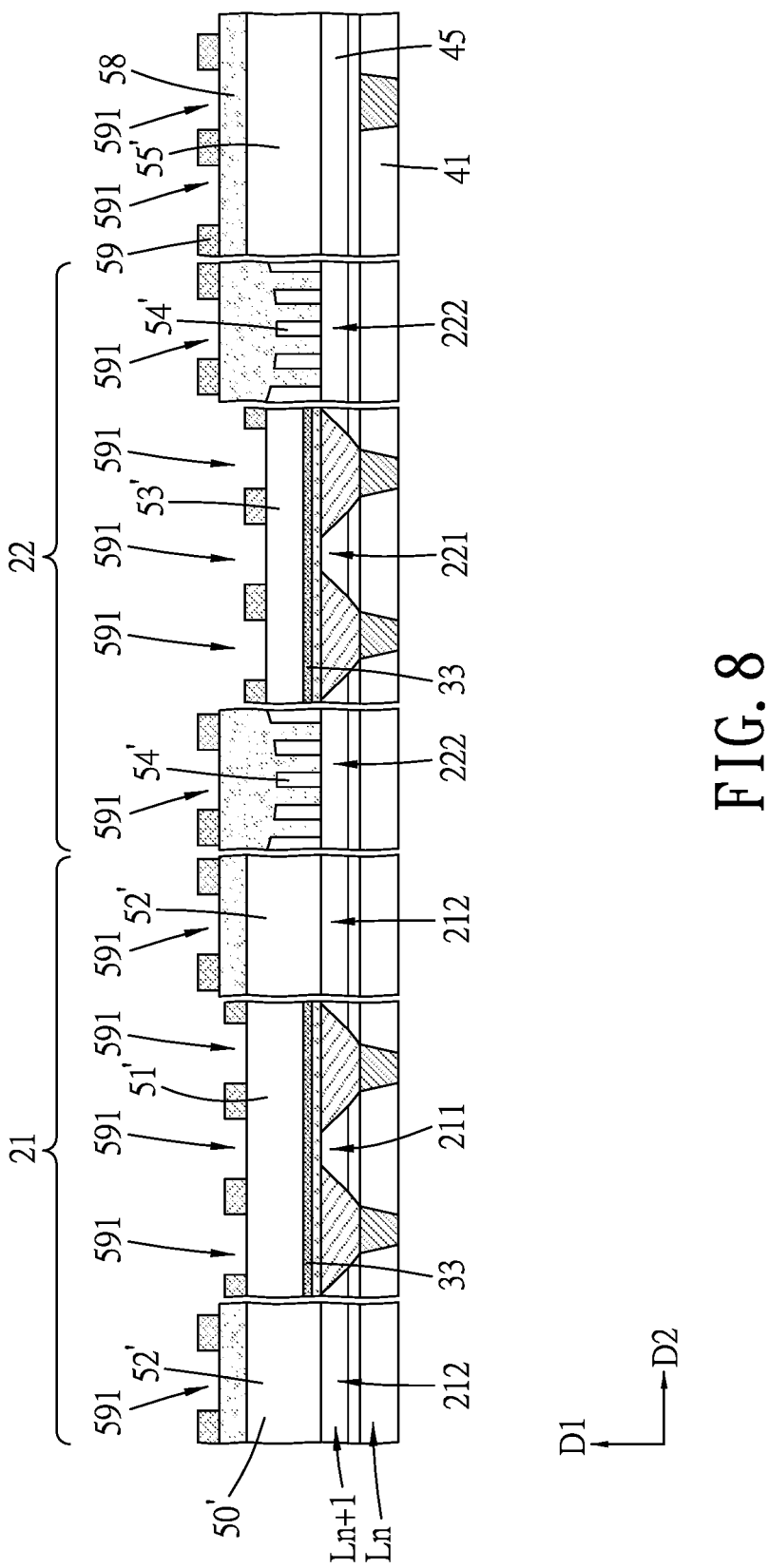
Figure 9:
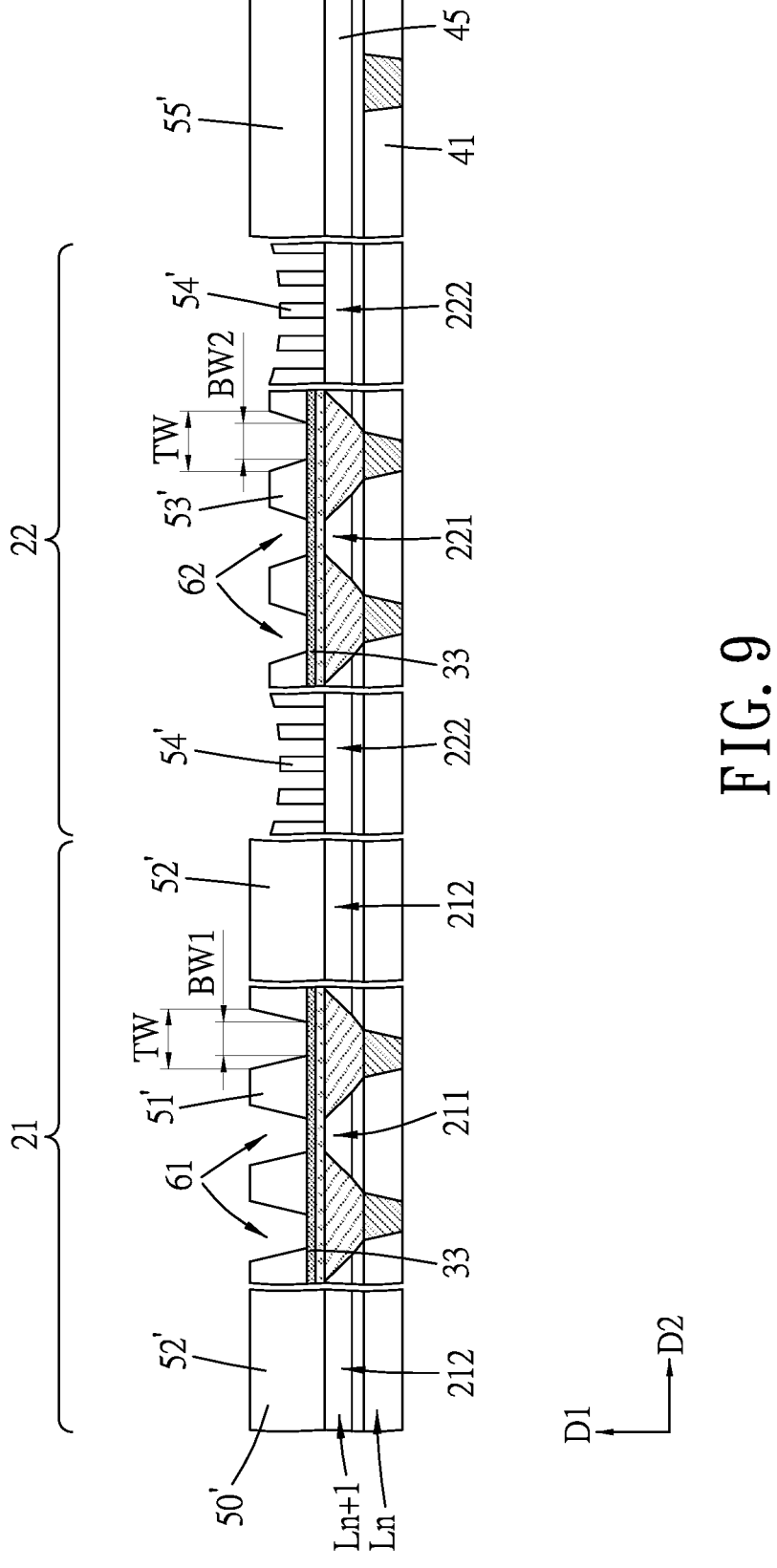

Referring to FIG. 1 and the example illustrated in FIGS. 8 and 9, the method proceeds to step 104, where first recesses 61 are formed in the planarized first dielectric portion 51', and second recesses 62 are formed in the planarized second dielectric portion 53'. The first recesses 61 are formed to expose portions of the channel layer 33 of the first device region 211. The second recesses 62 are formed to expose portions of the channel layer 33 of the second device region 221. The first recesses 61 and the second recesses 62 have different profiles.

Step 104 may include the following sub-steps: (i) forming a patterned protection layer 58 over the planarized dielectric layer 50', such that the planarized first patterned portion 52' and the planarized second patterned portion 54' are covered by the patterned protection layer 58, and such that the planarized first dielectric portion 51' and the planarized second dielectric portion 53' are exposed from the patterned protection layer 58; (ii) forming a patterned mask layer 59 over the patterned protection layer 58 and the planarized dielectric layer 50', wherein the patterned mask layer 59 has a plurality of openings 591 each having the same width; (iii) patterning the planarized first dielectric portion 51' and the planarized second dielectric portion 53' through the patterned mask layer 59 such that portions of the planarized first dielectric portion 51' and portions of the planarized second dielectric portion 53' which are exposed from the openings 591 are removed, thereby forming the first recesses 61 in the planarized first dielectric portion 51' and the second recesses 62 in the planarized second dielectric portion 53'; and (iv) removing the patterned mask layer 59. Other suitable processes for forming the first and second recesses 61, 62 are within the contemplated scope of the present disclosure. In each of the sub-steps (i) to (iv) of step 104, one or more deposition processes (such as CVD, ALD, other suitable processes, or combinations thereof), one or more patterned photoresist formation processes (such as coating a photoresist, exposing the photoresist through a photomask, developing the photoresist to form a patterned photoresist, and/or other suitable processes), one or more etching processes using or without using the patterned photoresist (such as dry etching, wet etching, anisotropic etching, other suitable techniques, or combinations thereof), one or more planarization processes (such as, CMP, or other suitable processes, and/or other suitable processes) may be used, but not limited thereto.

In sub-step (ii), one may adopt any suitable processes, such as a self-aligned-litho-etch-litho-etch (SALE-2) process, or a self-aligned-double patterning process, but are not limited thereto. Other suitable processes for obtaining the pattern mask layer 59 are within the contemplated scope of the present disclosure. In some embodiments, the SALE-2 process is adopted. In some embodiments, the openings 591 may be spaced apart from each other by the same distance in a second direction D2 transverse (e.g., perpendicular) to the first direction D1. That is, as the pattern mask layer 59 is formed over the planarized dielectric layer 50', the openings 591 of the pattern mask layer 59 may be formed with the same width in the second direction D2 and may be equally spaced apart from each other over both the first device portion 21 and the second device portion 22.

In sub-step (iii), the patterning process may be any suitable processes, such as an etching process, but is not limited thereto. Other suitable patterning processes to form the first and second recesses 61, 62 are within the contemplated scope of the present disclosure. Considering that the planarized first and second dielectric portions 51', 53' have different heights, and that the patterning of the planarized first and second dielectric portions 51', 53' through the pattern mask layer 59 are performed under the same condition, the first and second recesses 61, 62 are formed with different profiles, and may have different aspect ratios. For example, as shown in FIG. 9, the first recesses 61 (in the planarized first dielectric portion 51' with the relatively greater first height H1, see FIG. 7) are formed with a relatively greater height than the second recesses 62 (in the planarized second dielectric portion 53' with the relatively smaller second height H2). In addition, the first recesses 61 are each formed with a relatively smaller bottom width (BW1) than a bottom width (BW2) of each of the second recesses 62. The different profiles of the first and second recesses 61, 62 contribute to a first distance (see also Lg1 shown in FIG. 10) defined between bottoms of two adjacent ones of the first recesses 61 being different from a second distance defined between bottoms of two adjacent ones of the second recesses 62 (see also Lg2 shown in FIG. 10).

Since the patterning process is performed using the pattern mask layer 59 with openings 591 that have the same width, the first and second recesses 61, 62 also have the same top widths (TW). In addition, since the openings 591 of the pattern mask layer 59 are equally spaced apart from each other, the bottoms of any two adjacent ones of the first recesses 61 are spaced apart from each other by the same distance (i.e., the first distance), and the bottoms of any two adjacent ones of the second recesses 62 are spaced apart from each other by the same distance (i.e., the second distance).

In some embodiments, the planarized logic dielectric portion 55' may also be covered by the patterned protection layer 58 in sub-step (i) and the patterned mask layer 59 in sub-step (ii), and thus is not patterned in sub-step (iii), as shown in FIGS. 8 and 9.

Figure 10:
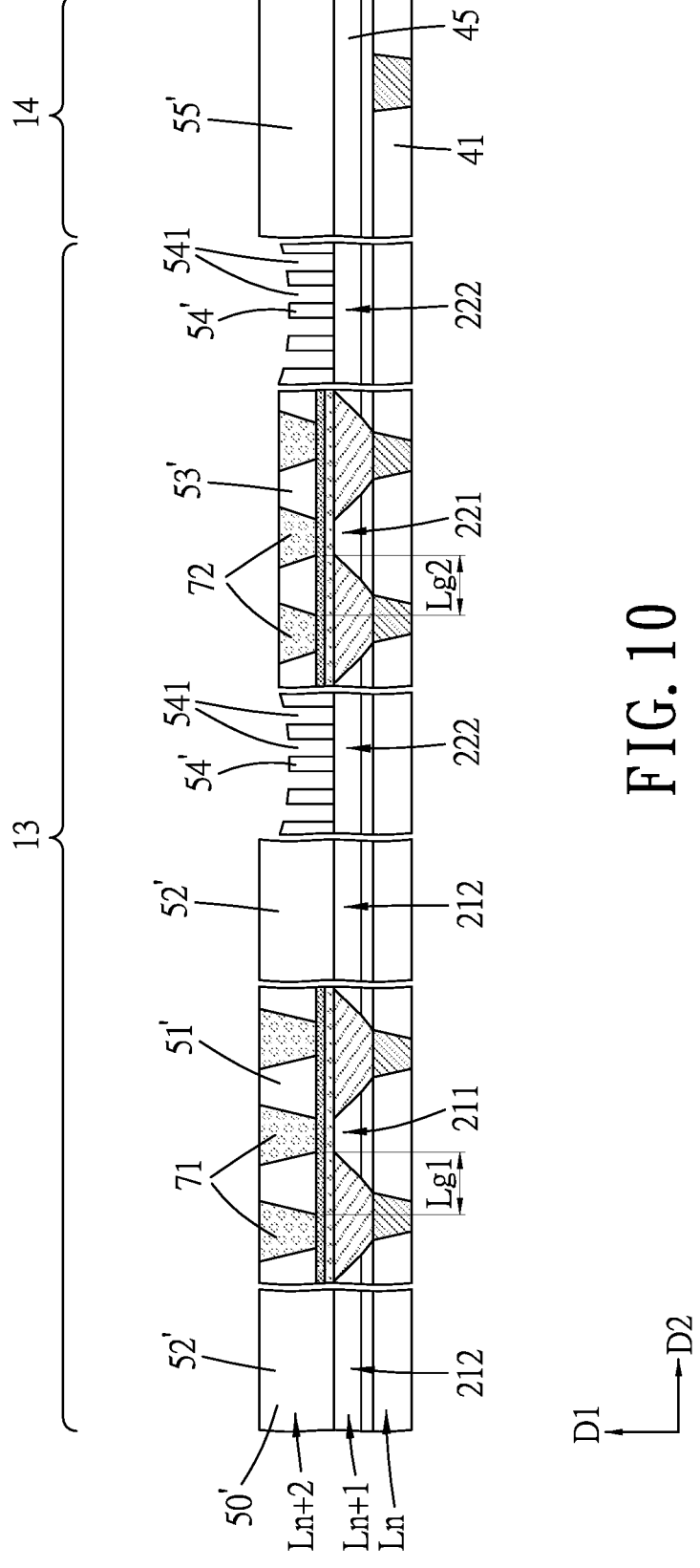

Referring to FIG. 1 and the example illustrated in FIG. 10, the method proceeds to step 105, where first source/drain contacts 71 are formed to fill the first recesses 61 (see also FIG. 9), and second source/drain contacts 72 are formed to fill the second recesses 62.

In some embodiments, step 105 may include the following sub-steps: (i) depositing a conductive filling material (not shown) over the planarized dielectric layer 50' to fill the first and second recesses 61, 62; and (ii) removing excessive amount of the conductive filling material and removing the patterned protection layer 58 shown in FIG. 8, thereby forming the first and second source/drain contacts 71, 72. In sub-step (i) of step 105, with the provision of the patterned protection layer 58 shown in FIG. 8, the conductive filling material is prevented from being directly formed on the elements 52', 54', and 55'. In addition, the conductive filling material may be the same as or different from the material of the contact components 42, 43. The deposition process may be CVD, ALD, other suitable processes, or combinations thereof. In sub-step (ii) of step 105, the removal of the conductive filling material may be performed by a planarization process, such as CMP process, but is not limited thereto, and certain portions of the patterned protection layer 58 may be removed by the planarization process, and remaining portions of the patterned protection layer 58 may be removed by wet stripping, plasma ashing, or any other suitable processes. Besides, the conductive filling material formed on the patterned protection layer 58 may be removed together with the patterned protection layer 58. Other suitable materials and/or processes for forming the first and second source/drain contacts 71, 72 are within the contemplated scope of the present disclosure. In some embodiments, after the planarization process in sub-step (ii) of step 105, the height of each of the elements 51', 52', 53', 54' and 55' may be reduced in the first direction D1 compared to the height of the structure after step 104.

A distance defined between bottoms of two adjacent ones of source/drain contacts is known as a channel length (Lg) of a device. At the first device region 211, a first channel length Lg1 defined between bottoms of two adjacent ones of the first source/drain contacts 71 is equivalent to the first distance described with reference to FIG. 9. At the second device region 221, a second channel length Lg2 defined between bottoms of two adjacent ones of the second source/drain contacts 72 is equivalent to the second distance described with reference FIG. 9. That is, the first channel length Lg1 is different from the second channel length Lg2. In some embodiments, the first and second channel lengths Lg1, Lg2 are within a range of about 10 nm to about 30 nm, such as about 20 nm to about 30 nm, and differ by about 5 nm to about 8 nm. As shown in FIG. 10, the second channel length Lg2 is smaller than the first channel length Lg1. Other suitable ranges for the first and second channel lengths Lg1, Lg2, and difference therebetween are within the contemplated scope of the present disclosure.

In addition, in some embodiments, the devices at the first device region 211 have the uniform first channel length Lg1, as a result of the bottoms of any two adjacent ones of the first recesses 61 being spaced apart from each other by the same distance (i.e., the first distance described in FIG. 9). In addition, the devices at the second device region 221 may also have the uniform second channel length Lg2, as a result of the bottoms of any two adjacent ones of the second recesses 62 being spaced apart from each other by the same distance (i.e., the second distance described in FIG. 9), thanks to the use of the pattern mask layer 59 having the openings 591 (see FIG. 8) that have the same width and that are equally spaced apart from each other.

By completing step 105, the first and second source/drain contacts 71, 72 are formed to respectively connecting the devices at the first and second device regions 211, 221 to an external power source (not shown), and the interconnect level structure Ln+2 is obtained.

Figure 11:
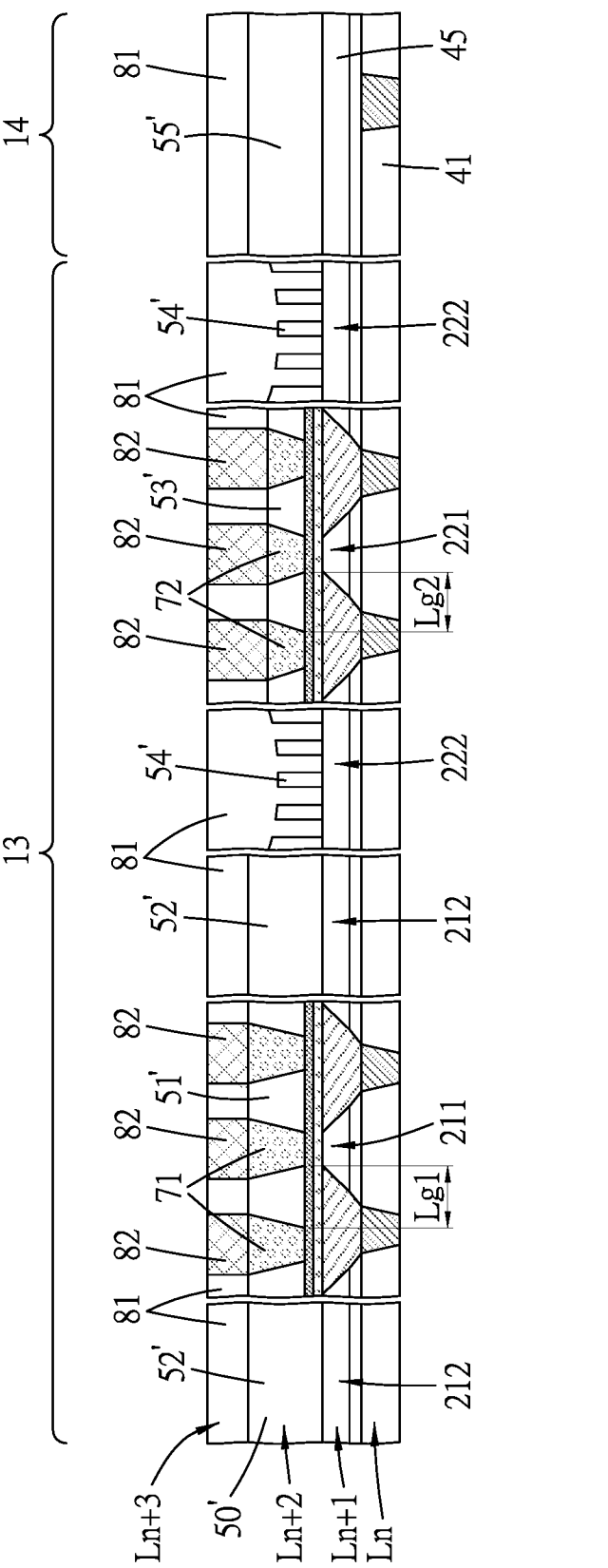

Referring to FIG. 1 and the example illustrated in FIG. 11, the method proceeds to step 106, where the interconnect level structure Ln+3 is formed over the interconnect level structure Ln+2.

In some embodiments, step 106 may include the following sub-steps: (i) forming an ILD material layer (not shown, which is to form ILD 81) over the interconnect level structure Ln+2; (ii) patterning the ILD material layer to form recesses (not shown) in the ILD 81; and (iii) forming connecting components 82 in the recesses, thereby forming the the the interconnect level structure Ln+3, and thus the semiconductor structure of the present disclosure is obtained. In the sub-steps (i) to (iii) of step 106, one or more deposition processes (such as CVD, ALD, other suitable processes, or combinations thereof), one or more patterned photoresist formation processes (such as coating a photoresist, exposing the photoresist through a photomask, developing the photoresist to form a patterned photoresist, and/or other suitable processes), one or more stripping or ashing processes for removal of the patterned photoresist, one or more etching processes using or without using the patterned photoresist (such as dry etching, wet etching, anisotropic etching, other suitable techniques, or combinations thereof), one or more planarization processes (such as, CMP, or other suitable processes, and/or other suitable processes) may be used, but not limited thereto.

In sub-step (i) of step 106, the ILD material layer may fill any grooves, or gaps among the dummy insertions of each of the planarized first and second patterned portions 52', 54' (e.g., the grooves 541 shown in FIG. 10). the material for forming the ILD 81 may be the same as or different the material of the ILD 41 described in FIG. 2, and the material for forming the connecting components 82 may be the same as or different from that of the contact components 42, 43. Other suitable materials and/or processes for forming the interconnect level structure Ln+3 are within the contemplated scope of the present disclosure. In sub-step (ii) of step 106, the recesses are configured to expose the first and second source/drain contacts 71, 72 from the ILD 81, such that the connecting components 82 formed in sub-step (iii) may respectively connected to the first or second source/drain contacts 71, 72. In some embodiments, the connecting components 82 may serve as metal lines, but are not limited thereto.

In the example illustrated in FIGS. 2 to 11, only two device portions (the first and second device portions 21, 22) are shown, but is not limited thereto. In other embodiments, there may be more than two device portions, and the devices in each of the device portions may have different channel lengths. This is conducive to provide devices with different electrical properties and different working performances, so as to serve different uses. For instance, in some cases, when a larger working current ($I_{on}$) is desired, the devices may be designed to have a shorter channel length. In other cases, when a smaller leakage current is desired, the devices may be designed to have a longer channel length so as to achieve a higher threshold voltage. In this sense, devices with different channel lengths may be produced at the same time in a simple process flow without using extra mask in formation of recesses for accommodating the sources/drain contacts.

In some embodiments, metal lines/vias (not shown in FIG. 11) may be further formed in the interconnect level structures Ln+1, Ln+2, and Ln+3 at the logic area 14 during formation of the devices at the memory area 13.

Apart from forming devices with different channel lengths in BEOL, the method of the present disclosure may also be modified and adopted in other applications to achieve recesses having different profiles. For instance, at step 101, the base element 10 may include any suitable components, and are not limited to those described with reference to FIG. 2. Step 102 may be similar to that described with reference to FIGS. 3 to 5, so as to achieve a first plain portion 51 aside by a first patterned portion 52, and a second plain portion 53 aside by a second patterned portion 54, wherein the first and second plain portions are respectively equivalent to the first and second dielectric portions described in FIGS. 3 to 5, and the first and second patterned portions 52, 54 are formed with different patterns (different configurations of the dummy insertions). Details thereof are omitted for the sake of brevity. Step 103 may be similar to that described with reference to FIG. 7 so as to obtain the planarized first and second plain portions 51, 53 having different height in the first direction D1. Step 104 may be similar to that described with reference to FIGS. 8 to 9 so as to obtain the first and second recesses 61, 62 having different profiles, such as different aspect ratios. Number of the first recesses 61 and the second recesses 62 formed may be determined according to practical needs, such as one, or more. As, such, the first recesses 61 may have a critical dimension different from that of the second recesses 62. In some embodiments, the aspect ratio of each of the first and second recesses 61, 62 may range from about 5 to about 15. Other suitable ranges of the aspect ratio of the first and second recesses 61, 62 are within the contemplated scope of the present disclosure. At step 105, any other suitable components and/or materials may serve as a first filling element 71 filling the first recesses 61, and a second filling element 72 filling the second recesses 62. Step 106 may be omitted, or additional steps may be included according to practical needs. Other suitable modifications for the steps of the method are within the contemplated scope of the present disclosure.

The embodiments of the present disclosure have the following advantageous features. By virtue of forming the first and second patterned portions 52, 54 with different patterns, after the planarization process over the dielectric layer 50, the planarized first and second dielectric portions 51', 53' exhibit a height difference, and patterning of the planarized first and second dielectric portions 51', 53' results in formation of the first and second recesses 61, 62 with different profiles. The first distance defined between the bottoms of two adjacent ones of the first recesses 61 is different from the second distance defined between the bottoms of two adjacent ones of the second recesses 62. Accordingly, after forming the first and second source/drain contacts 71, 72 respectively in the first and second recesses 61, 62, the first channel length of the devices at the first device region 211 is thus different from the second channel length of the devices at the second device region 221. That is, the method according to the present disclosure, with a simple process flow, enables preparation of BEOL devices with different channel lengths.

In accordance with some embodiments of the present disclosure, a method for manufacturing a semiconductor structure includes: forming an interconnect level structure having a first device portion including a first device region and a first side region aside the first device region, and a second device portion displaced apart from the first device portion, and including a second device region and a second side region aside the second device region; forming a dielectric layer over the interconnect structure, the dielectric layer including a first dielectric portion formed over the first device region, a second dielectric portion formed over the second device region, a first patterned portion formed over the first side region, and a second patterned portion formed over the second side region, the first patterned portion and the second patterned portion being formed with different patterns; performing a planarization process on the dielectric layer such that a top surface of the planarized first dielectric portion is at a level different from that of a top surface of the planarized second dielectric portion; forming first recesses in the planarized first dielectric portion and second recesses in the planarized second dielectric portion, a distance between bottoms of two adjacent ones of the first recesses being different from a distance between bottoms of two adjacent ones of the second recesses; and forming contact portions respectively in the first recesses and the second recesses.

In accordance with some embodiments of the present disclosure, the interconnect level structure further includes a logic area spaced apart from the first device region and the second device region; the dielectric layer is formed over the first device portion, the second device portion and the logic area; and the planarization process is performed over the first device portion, the second device portion and the logic area.

In accordance with some embodiments of the present disclosure, forming the dielectric layer includes: forming a dielectric material layer over the interconnect level structure; forming a shielding mask over the dielectric material layer, the shielding mask covering a first portion of the dielectric material layer and partially exposing a second portion of the dielectric material layer; and patterning the dielectric material layer through the shielding mask such that the first portion of the dielectric material layer covered by the shielding mask serves as the first dielectric portion, the second dielectric portion and the first patterned portion, and such that the second portion of the dielectric material layer is patterned to form the second patterned portion.

In accordance with some embodiments of the present disclosure, in forming the dielectric layer, each of the first dielectric portion and the second dielectric portion is formed to have a planar surface opposite to a corresponding one of the first device region and the second device region.

In accordance with some embodiments of the present disclosure, the planar surfaces of the first dielectric portion and the second dielectric portion are flush with each other.

In accordance with some embodiments of the present disclosure, in forming the dielectric layer, each of the first patterned portion and the second patterned portion is independently formed into at least one dummy insertion.

In accordance with some embodiments of the present disclosure, in forming the dielectric layer, a configuration of the at least one dummy insertion of the first patterned portion is different from that of the second patterned portion.

In accordance with some embodiments of the present disclosure, the first recesses and the second recesses are formed to have different profiles.

In accordance with some embodiments of the present disclosure, a method for manufacturing a semiconductor structure includes: forming a base element; forming a dielectric layer over the base element, the dielectric layer having a first plain portion, a first patterned portion aside the first plain portion, a second plain portion spaced apart from the first plain portion, and a second patterned portion aside the second plain portion, the second patterned portion having a pattern different from that of the first patterned portion; performing a planarization process on the dielectric layer such that a top surface of the planarized first plain portion is at a level different from that of a top surface of the planarized second plain portion; forming first recesses in the planarized first plain portion and forming second recesses in the planarized second plain portion, the first recesses having a profile different from that of the second recesses; and filling the first recesses and the second recesses with filling elements.

In accordance with some embodiments of the present disclosure, in the planarization process, a height of the planarized plain portion is different from a height of the planarized plain portion.

In accordance with some embodiments of the present disclosure, in forming the dielectric layer, top surfaces of the first plain portion and the second plain portion are flush with each other.

In accordance with some embodiments of the present disclosure, in forming the dielectric layer, each of the first patterned portion and the second patterned portion is independently formed into at least one dummy insertion.

In accordance with some embodiments of the present disclosure, in forming the dielectric layer, a configuration of the at least one dummy insertion of the first patterned portion is different from that of the second patterned portion.

In accordance with some embodiments of the present disclosure, forming the first recesses and the second recesses includes: forming a patterned protection layer over the planarized dielectric layer such that the planarized first patterned portion and the planarized second patterned portion are covered by the patterned protection layer, and the planarized first plain portion and the planarized second plain portion are exposed from the patterned protection layer; forming a patterned mask layer over the patterned protection layer and the planarized dielectric layer, the patterned mask layer having a plurality of openings each having the same width; and patterning the planarized first plain portion and the planarized second plain portion through the patterned mask layer such that portions of the planarized first plain portion and the planarized second plain portion which are exposed from the openings are removed to form the first recesses and the second recesses.

In accordance with some embodiments of the present disclosure, top widths of the first recesses and the second recesses are the same.

In accordance with some embodiments of the present disclosure, a bottom width of each of the first recesses is different from a bottom width of each of the second recesses.

In accordance with some embodiments of the present disclosure, a semiconductor structure includes a first device region, a second device region, first source/drain contacts and second source/drain contacts. Each of the first device region and the second device region has a channel layer, a gate element separated from the channel layer, and a dielectric layer disposed between the channel layer and the gate element. The first source/drain contacts are disposed on the channel layer of the first device region opposite to the gate element. Bottoms of two adjacent ones of the first source/drain contacts over the first device region are spaced apart from each other by a first distance. The second source/drain contacts are disposed on the channel layer of the second device region opposite to the gate element. Bottoms of two adjacent ones of the second source/drain contacts over the second device region are spaced apart from each other by a second distance. The first distance is different from the second distance.

In accordance with some embodiments of the present disclosure, a height of the first source/drain contacts is different from a height of the second source/drain contacts.

In accordance with some embodiments of the present disclosure, the difference between the first distance and the second distance ranges from 5 nm to 8 nm.

In accordance with some embodiments of the present disclosure, the semiconductor structure further includes a logic area spaced apart from the first device region and the second device region, and including a conductive component and a dielectric component.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming an interconnect level structure having a first device portion including a first device region and a first side region aside the first device region, and a second device portion displaced apart from the first device portion, and including a second device region and a second side region aside the second device region;

forming a dielectric layer over the interconnect structure, the dielectric layer including a first dielectric portion formed over the first device region, a second dielectric portion formed over the second device region, a first patterned portion formed over the first side region, and a second patterned portion formed over the second side region, the first patterned portion and the second patterned portion being formed with different patterns;

performing a planarization process on the dielectric layer such that a top surface of the planarized first dielectric portion is at a level different from a level of a top surface of the planarized second dielectric portion;

forming first recesses in the planarized first dielectric portion and second recesses in the planarized second dielectric portion, a distance between bottoms of two adjacent ones of the first recesses being different from a distance between bottoms of two adjacent ones of the second recesses; and forming contact portions respectively in the first recesses and the second recesses.

2. The method according to claim 1, wherein:

the interconnect level structure further includes a logic area spaced apart from the first device region and the second device region;

the dielectric layer is formed over the first device portion, the second device portion and the logic area; and the planarization process is performed over the first device portion, the second device portion and the logic area.

3. The method according to claim 1, wherein forming the dielectric layer includes:

forming a dielectric material layer over the interconnect level structure;

forming a shielding mask over the dielectric material layer, the shielding mask covering a first portion of the dielectric material layer and partially exposing a second portion of the dielectric material layer; and patterning the dielectric material layer through the shielding mask such that the first portion of the dielectric material layer covered by the shielding mask serves as the first dielectric portion, the second dielectric portion and the first patterned portion, and such that the second portion of the dielectric material layer is patterned to form the second patterned portion.

4. The method according to claim 1, wherein in forming the dielectric layer, each of the first dielectric portion and the second dielectric portion is formed to have a planar surface opposite to a corresponding one of the first device region and the second device region.

5. The method according to claim 4, wherein the planar surfaces of the first dielectric portion and the second dielectric portion are flush with each other.

6. The method according to claim 1, wherein in forming the dielectric layer, the first patterned portion has at least one dummy insertion, and the second patterned portion has at least one dummy insertion.

7. The method according to claim 6, wherein in forming the dielectric layer, a configuration of the at least one dummy insertion of the first patterned portion is different from a configuration of the at least one dummy insertion of the second patterned portion.

8. The method according to claim 1, wherein the first recesses and the second recesses are formed to have different profiles.

9. A method for manufacturing a semiconductor structure, comprising:

forming a base element;

forming a dielectric layer over the base element, the dielectric layer having a first plain portion, a first patterned portion aside the first plain portion, a second plain portion spaced apart from the first plain portion, and a second patterned portion aside the second plain portion, the second patterned portion having a pattern different from a pattern of the first patterned portion;

performing a planarization process on the dielectric layer such that a top surface of the planarized first plain portion is at a level different from a level of a top surface of the planarized second plain portion;

forming first recesses in the planarized first plain portion and forming second recesses in the planarized second plain portion, the first recesses having a profile different from a profile of the second recesses; and filling the first recesses and the second recesses with filling elements.

10. The method according to claim 9, wherein in the planarization process, a height of the planarized first plain portion is different from a height of the planarized second plain portion.

11. The method according to claim 9, wherein in forming the dielectric layer, top surfaces of the first plain portion and the second plain portion are flush with each other.

12. The method according to claim 9, wherein forming the first recesses and the second recesses includes:

forming a patterned protection layer over the planarized dielectric layer such that the planarized first patterned portion and the planarized second patterned portion are covered by the patterned protection layer, and the planarized first plain portion and the planarized second plain portion are exposed from the patterned protection layer;

forming a patterned mask layer over the patterned protection layer and the planarized dielectric layer, the patterned mask layer having openings each having the same width; and patterning the planarized first plain portion and the planarized second plain portion through the patterned mask layer such that portions of the planarized first plain portion and the planarized second plain portion which are exposed from the openings are removed to form the first recesses and the second recesses.

13. The method according to claim 12, wherein top widths of the first recesses and the second recesses are the same.

14. The method according to claim 9, wherein a bottom width of each of the first recesses is different from a bottom width of each of the second recesses.

15. A method for manufacturing a semiconductor structure, comprising:

depositing a lower dielectric layer over a base structure, the lower dielectric layer including a first device region, a second device region spaced apart from the first device region, a first side region aside the first device region, and a second side region aside the second device region;

forming a first gate element and a second gate element respectively in the first device region and the second device region;

sequentially depositing a gate dielectric material layer and a channel material layer over the lower dielectric layer to cover the first gate element and the second gate element;

removing portions of the channel material layer respectively on the first side region and the second side region, so as to form the channel material layer into a first channel layer on the first device region, and a second channel layer on the second device region;

removing portions of the gate dielectric layer respectively on the first side region and the second side region, so as to form the gate dielectric layer into a first gate dielectric between the first channel layer and the first gate element, and a second gate dielectric between the second channel layer and the second gate element;

depositing an upper dielectric layer to cover the first channel layer, the second channel layer, the first side region, and the second side region;

forming grooves in the upper dielectric layer, the grooves partially exposing the second side region while the first channel layer and the second channel layer are prevented from being exposed from the grooves;

after forming the grooves, performing a planarization process on the upper dielectric layer such that after the planarization process, a thickness of a first dielectric portion of the upper dielectric layer on the first channel layer is larger than a thickness of a second dielectric portion of the upper dielectric layer on the second channel layer;

after the planarization process, forming first recesses in the first dielectric portion to partially expose the first channel layer, and forming second recesses in the second dielectric portion to partially expose the second channel layer;

forming first source/drain contacts respectively in the first recesses, and forming second source/drain contacts respectively in the second recesses.

16. The method according to claim 15, wherein the first side region surrounds the first device region, and the second side region surrounds the second device region.

17. The method according to claim 15, wherein the first side region is not exposed from the grooves.

18. The method according to claim 15, wherein the grooves include at least one first groove which partially exposes the first side region, and second grooves which partially expose the second side region, a number of the at least one first groove being less than a number of the second grooves.

19. The method according to claim 15, wherein:

the first recesses and the second recesses are formed simultaneously; and in forming the first recesses and the second recesses, portions of the upper dielectric layer, which cover the first side region and the second side region, are protected by a patterned protection layer.

20. The method according to claim 19, further comprising:

removing the patterned protection layer after forming the first source/drain contacts and the second source/drain contacts.

* * * * *